United States Patent
Solis

[11] Patent Number: 5,851,302
[45] Date of Patent: Dec. 22, 1998

[54] METHOD FOR DRY ETCHING SIDEWALL POLYMER

[75] Inventor: Ramiro Solis, Bandera, Tex.

[73] Assignee: VLSI Technology, Inc., San Jose, Calif.

[21] Appl. No.: 803,180

[22] Filed: Feb. 19, 1997

[51] Int. Cl.$^6$ ............................................. H01L 21/302
[52] U.S. Cl. ........................... 134/1.2; 438/696; 438/725; 438/723; 438/734; 438/740
[58] Field of Search .................. 134/1.2; 438/696, 438/725, 734, 740, 723, 743

[56] References Cited

U.S. PATENT DOCUMENTS

| | | | |
|---|---|---|---|
| 4,123,841 | 11/1978 | Yano et al. | 29/570 |
| 4,514,254 | 4/1985 | Klepner | 156/656 |
| 4,670,091 | 6/1987 | Thomas et al. | 156/643 |
| 4,897,153 | 1/1990 | Cole et al. | 156/643 |
| 5,077,598 | 12/1991 | Bartelink | 357/68 |
| 5,348,619 | 9/1994 | Bohannon et al. | 156/664 |
| 5,358,602 | 10/1994 | Sutcliffe et al. | 156/656 |
| 5,382,316 | 1/1995 | Hills et al. | 156/643 |
| 5,451,291 | 9/1995 | Park et al. | 156/644.1 |
| 5,485,304 | 1/1996 | Kaeriyama | 359/291 |
| 5,497,262 | 3/1996 | Kaeriyama | 359/223 |
| 5,512,507 | 4/1996 | Yang et al. | 437/48 |
| 5,521,104 | 5/1996 | Walker | 437/3 |
| 5,526,951 | 6/1996 | Bailey et al. | 216/24 |
| 5,573,971 | 11/1996 | Cleeves | 437/60 |
| 5,578,163 | 11/1996 | Yachi | 156/643.1 |
| 5,661,083 | 8/1997 | Chen et al. | 438/637 |

*Primary Examiner*—Bruce Breneman
*Assistant Examiner*—George Goudreau
*Attorney, Agent, or Firm*—Burns, Doane, Swecker & Mathis, LLP

[57] ABSTRACT

A method of plasma etching photoresist and sidewall polymer with an etch gas mixture comprising $CF_4$ and $H_2O$ demonstrating very aggressive ashrate of photoresist but maintains an exceptionally low etch rate for titanium nitride and other metals is provided. The very low TiN etch rate permits the inventive method to effectively breakdown sidewall polymer without removing any significant amount of these metals. The invention is particularly suited for stripping sidewall polymer from etched via holes and from etched metal lines.

24 Claims, 3 Drawing Sheets

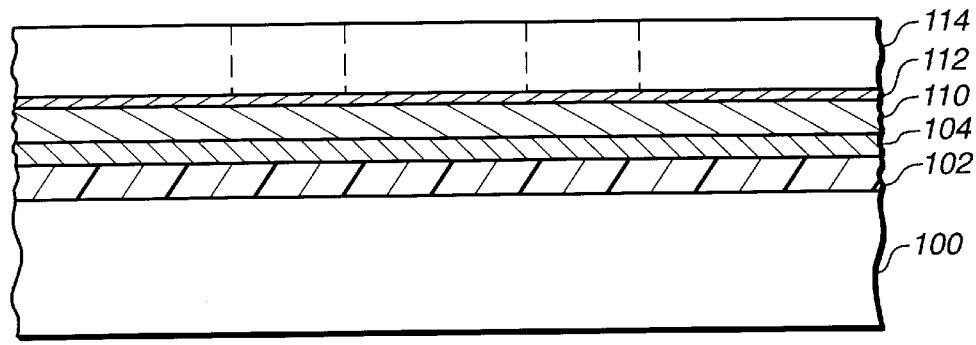
FIG._1A
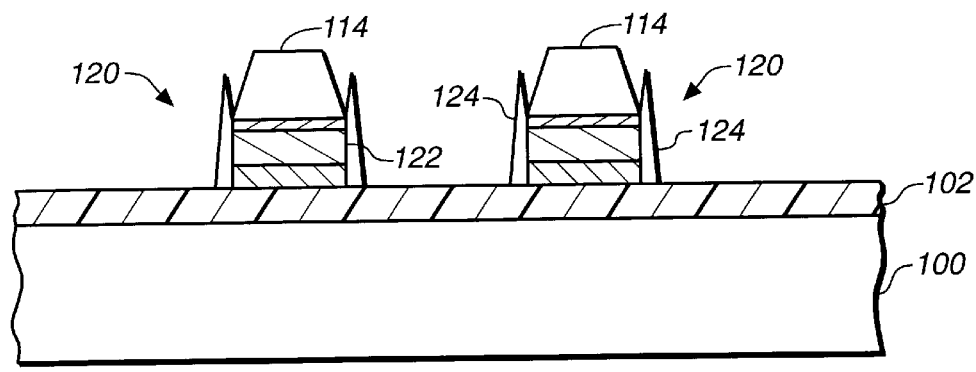
FIG._1B
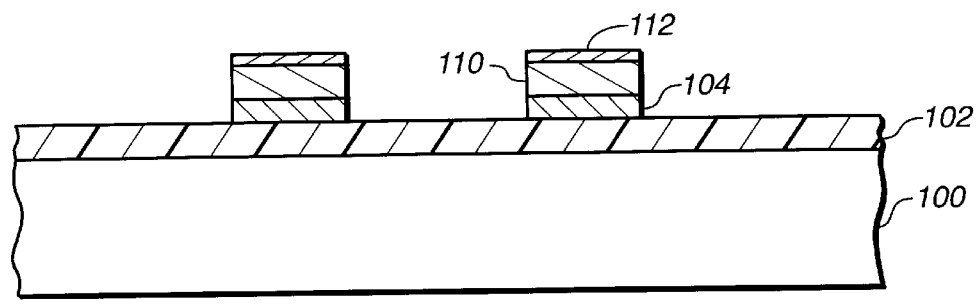
FIG._1C

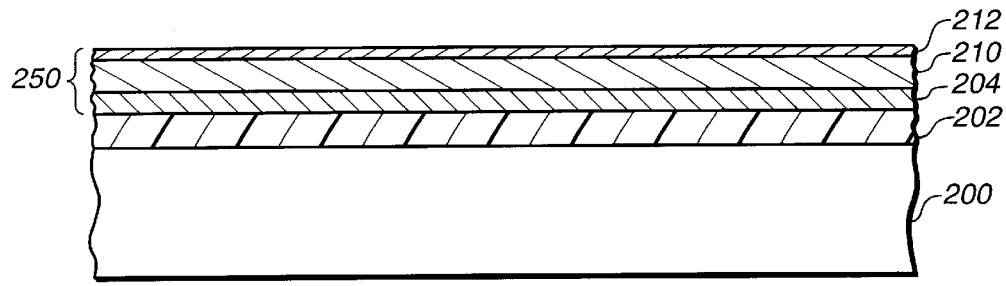
FIG._2A
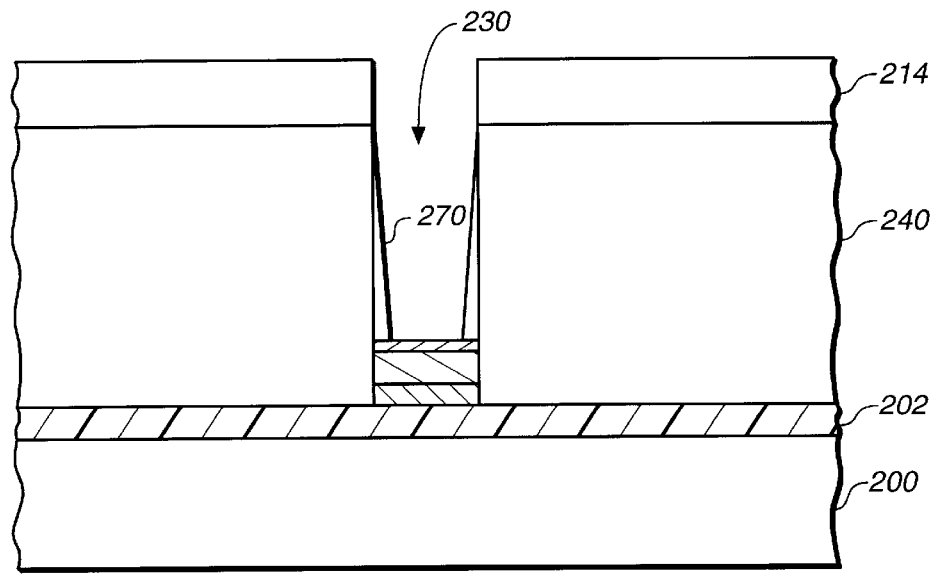
FIG._2B
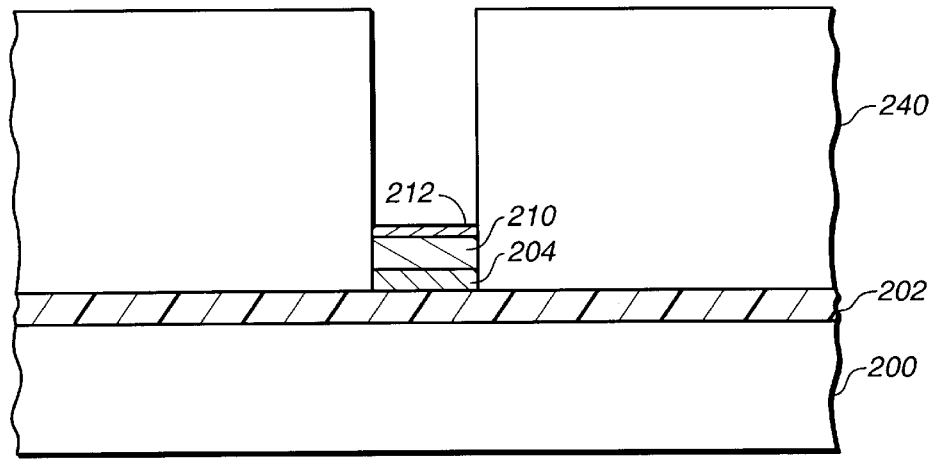
FIG._2C

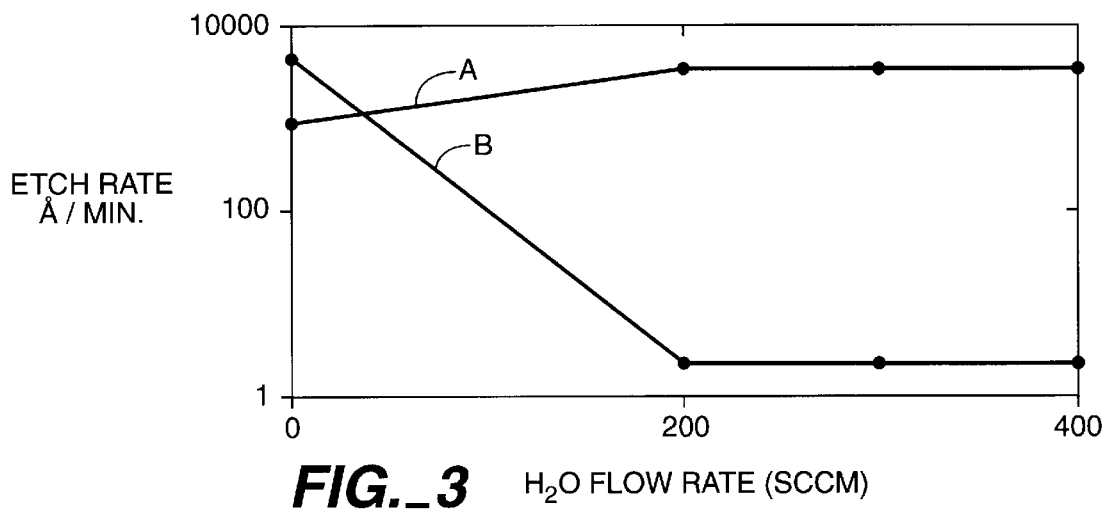
FIG._3  H₂O FLOW RATE (SCCM)
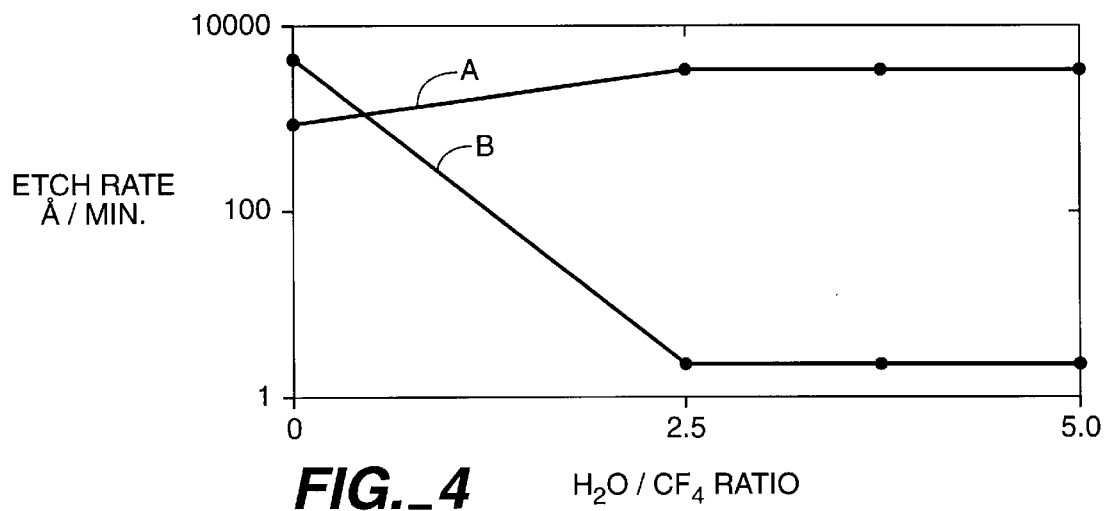
FIG._4  H₂O / CF₄ RATIO

METHOD FOR DRY ETCHING SIDEWALL POLYMER

FIELD OF THE INVENTION

The present invention relates generally to methods of selectively removing sidewall polymers from semiconductor wafers. More particularly, the invention employs plasma etching using an etch gas mixture containing $CF_4$ and $H_2O$ to selectively strip sidewall polymers with negligible metal lift-off.

BACKGROUND OF THE INVENTION

In semiconductor fabrication, photoresist (or resist) must be removed following a wide variety of processing steps, including etching (wet and dry), ion implantation, lift-off processes, high temperature postbake (for improving resist adhesion or etch resistance), or merely simple removal of misaligned resist patterns for reimaging after development and inspection ("rework"). In addition, wafer surface patterns of several different materials may be present under the resist (e.g. $SiO_2$, aluminum, polysilicon, silicides, deposited $SiO_2$ or $Si_3N_4$ or polyimide). The main objective in resist stripping is to insure that all the photoresist is removed as quickly as possible without attacking any underlying surface materials. Resist stripping techniques are generally divided into three classes: 1) organic strippers; 2) oxidizing-type (inorganic) strippers; and 3) dry type stripping techniques. Dry etching of resist is done using oxygen plasmas in plasma etching equipment. Dry etching offers several advantages over wet resist strippers including safer operating conditions, no metal ion contamination, reduced pollution problems, and less attack of most underlying substrate materials.

The density of devices fabricated on semiconductor substrates has increased steadily over the years with ultra large scale integration. Accompanying this trend have been decreased feature sizes and increased demands on process technology. To pattern such small features, conventional lithographic procedures are being supplanted by newer ones based on diffusion enhanced silylated resist DESIRE™ processes. Diffusion enhanced silylated processes can produce sub-half micron features in various resists, using one line and deep ultra violet light exposure. The resolution and throughput rate up to the image transfer step exceeds that of conventional positive resists and are clearly superior when topography is of major concern.

The resist is somewhat more difficult to remove with diffusion enhanced silylated resist processes as compared with conventional processes as a result of larger amounts of etch byproducts such as sidewall polymer on vertical walls of a device undergoing fabrication. These byproducts, generally referred to as polymers are generally comprised of a metal and $SiO_2$ molecule. For instance, the molecule can comprise carbon from the photoresist, metal from the metal layer and $SiO_2$. Further, sidewall polymers may comprise aluminum silicate and very small amounts of fluorocarbons. Fluorocarbons are non-combustible and therefor are not removed during an $O_2$ in-situ ash sequence of a metal etch. Thus, ashing has proven to be ineffective because of the high carbon content in the byproduct molecule from the photoresist. The difficulty with which resist can be removed has proven to be a sever impediment to the generation of sub-half micron features. Previously solvent/ultrasonic agitation had been used to remove SWP. However, these techniques prove to be unusable because of the tendency of metal, such as aluminum, to lift off of the minimum features. Further, these techniques tend to leave behind significant amounts of residue on device sidewalls and on device surfaces.

SUMMARY OF THE INVENTION

The present invention is based in part on the discovery that dry etching of photoresist and sidewall polymer with an etch gas mixture comprising $CF_4$ and $H_2O$ exhibits very aggressive ashrate of photoresist but maintains an exceptionally low etch rate for titanium nitride. The very low TiN etch rate permits the inventive method to effectively breakdown sidewall polymer without removing any significant amount TiN.

In one aspect, the invention is directed to a method of removing sidewall polymer from a semiconductor wafer that includes the steps of:

positioning said wafer into a chamber wherein the wafer includes sidewall polymer;

introducing effective amounts of $CF_4$ and $H_2O$ etchant gases into the chamber; and decomposing said etchant gases and plasma phase reacting the decomposed gases with the sidewall polymer.

In another aspect, the invention is directed to a method of removing sidewall polymer from a semiconductor wafer which includes an underlying metal that includes the steps of:

positioning said wafer into a chamber wherein the wafer includes sidewall polymer that is adjacent to the underlying metal;

introducing effective amounts of $CF_4$ and $H_2O$ etchant gases into the chamber; and decomposing said etchant gases and plasma phase reacting the decomposed gases with the sidewall polymer.

In a further aspect, the invention is directed to a method of removing post etch polymer residue from a semiconductor device containing a metal structure that includes the steps of:

positioning said semiconductor device into a chamber;

introducing effective amounts of $CF_4$ and $H_2O$ etchant gases into the chamber; and decomposing said etchant gases and plasma phase reacting the decomposed gases with the residue polymer.

In yet another aspect, the invention is directed to a method of forming a via contact hole in a semiconductor device that includes the steps of:

forming a metal layer on a wafer;

forming a dielectric layer on said metal layer;

forming a photoresist pattern after a photoresist layer is coated on said dielectric layer;

forming a via contact hole by an etching process employing said photoresist pattern as a mask; and removing a layer of sidewall polymer on said via contact hole and a part of said photoresist layer by a process comprising the steps of:

(i) positioning said semiconductor device into a chamber;

(ii) introducing effective amounts of $CF_4$ and $H_2O$ etchant gases into the chamber; and (iii) decomposing said etchant gases and plasma phase reacting the decomposed gases with the sidewall polymer.

Preferably, the relative amounts of $H_2O$ and $CF_4$ introduced into the chamber have a $H_2O$ flow rate to $CF_4$ flow rate ratio of at least about 2.5 to 1. With the inventive process, the ratio of the sidewall polymer etch rate to the metal etch rate is at least 5 to 1. Furthermore, the sidewall polymer is etched at a rate of at least about 5,000 Å per minute.

BRIEF DESCRIPTION OF THE DRAWINGS

FIGS. 1A through 1C are cross-sectional views illustrating the selective removal of photoresist and sidewall polymer from etched metal lines on a semiconductor device;

FIGS. 2A through 2C are cross-sectional views illustrating the selective removal of photoresist and sidewall polymer from etched metal etched via holes on a semiconductor device;

FIG. 3 is a graph of etch rates vs. $H_2O$ flowrate; and

FIG. 4 is a graph of etch rates vs. ratio of $H_2O$ to $CF_4$ flow rates.

DETAILED DESCRIPTION OF THE PREFERRED EMBODIMENTS

The inventive dry etching process can be implemented with any suitable plasma etching device. In the dry etch process, reactive species derived from the etchant gases are generated in a plasma and these species diffuse to the resist and/or sidewall polymer. Following adsorption of the species and chemical reactions with the formation of volatile by-products, these by-products are desorbed from the surface and the desorbed species diffuse into the bulk of the gas in the etching chamber. A critical feature is that the etch gas comprises a mixture that has effective amounts of $CF_4$ and $H_2O$ as further described herein.

Plasma etching systems comprise several components: a) an etching chamber, that is evacuated to reduced pressures; b) a pumping system for establishing and maintaining the reduced pressure; c) pressure gauges to monitor pressure in the chamber; d) a variable conductance between the pump and etching chamber so that the pressure and flow rate in the chamber can be controlled independently; e) an rf power supply to create the glow discharge; f) a gas handling capability to meter and control the flow of reactant gases; and g) electrodes. Detailed assembly of such systems from these components has evolved a variety of configurations, depending upon which parameters of a process need to be controlled, as well as the specific application of the system.

Wafers exposed to energetic ions of a plasma can be subjected to ion-assisted etching processes. Etcher configurations that utilize parallel electrodes can direct energetic ions at the surfaces being etched, by causing them to be accelerated across the potential difference that exists between the plasma and the electrode surfaces. As a result, both a physical and a chemical component can impart directionality to the etch process.

In parallel-electrode systems, the electrodes have a planar, circular shape, and are of approximately the same size. One of the two electrodes of the planar reactor configuration is connected to the rf supply, and the other to ground. Wafers can be placed on either of the electrodes. When wafers are etched in such systems by placing them on the grounded electrode, the system is said to be operated in the plasma etch mode. When wafers are placed directly on the rf-powered electrode, these systems are said to configured in an reactive ion etch mode.

The inventive method can be employed to selectively remove conventional photoresist including, for example, a positive resist such as a novolac-based resist that is spin-coated onto wafers. The method can also selectively remove modified resists such as diffusion enhanced silylated resist which is formed, for instance, by treating conventional positive photoresist with hexamethyldisilazine vapor prior to development. Therefore the term "photoresist or resist" shall include conventional resist and modified resist.

Referring to FIGS. 1A through 1C, there is shown a semiconductor substrate 100 having devices formed therein. The semiconductor substrate has a dielectric layer 102 formed therein. The dielectric is preferably $SiO_2$ that is deposited by conventional methods, such as, for example, chemical vapor deposition. A first metal layer 104 is formed on the surface of the dielectric layer. It is preferred that the layer 104 comprise TiN or TiW which is formed to a thickness of approximately 500 Å preferably by sputter deposition, however, physical vapor deposition or chemical vapor deposition can also be used.

A second metal layer 110 is formed over the first metal layer 104. It is preferred that the second metal layer 110 comprise aluminum or an aluminum alloy, such as AlCu, which is formed to a thickness of approximately 5000 Å. Next, a third metal layer 112 of metal comprising TiN or TiW and having a thickness of approximately 500 Å is formed on the second metal layer. Finally, a layer of photoresist material 114 is coated on the third metal layer 112 and is masked and patterned using conventional photoresist techniques to form a pattern that exposes the third metal layer 112 which is etched down to the top surface of the substrate to form a plurality of lines 120 as depicted in FIG. 1B, using reactive ion etching.

During the dry etching process which employs an rf field and $Cl_2$, $BCl_3$, $CHF_3$, and $SF_6$ individually or as the components of mixtures of several etchant gases at low pressure, a part of the metal layers, and often the dielectric layer as well, is etched away but a residual polymer 124 on the sidewall of the metal etchline 122 is created. The composition of this polymer layer 124 will vary depending on the etching process and the materials that are etched. As shown in FIG. 1C, following application of the inventive process, the photoresist layer and the residual polymer layer are effectively removed without etching any of the underlying metal layers. The inventive process can effectively remove resist and sidewall polymer from a semiconductor device when both are present and, as is apparent, the process can remove resist or sidewall polymer when only one material is present. As employed herein the term "sidewall polymer" or "polymer" refers to materials that may include resist material. The term "underlying metal" refer to metal, such as, the barrier, bulk conductor, or capping layer, that is in contact with sidewall polymer on a semiconductor device. The underlying metal may be positioned underneath the sidewall polymer or it may be juxtaposed to each other, or both. In any case, the high selectivity of the inventive process permits long exposure of the sidewall polymer to the plasma with negligible adverse effects on the underlying metal.

Substrate 100 includes a semiconductor substrate such as, but not limited to, silicon on which a plurality of active and passive devices can be formed. The dielectric layer is used to electronically isolate the subsequently formed metallization layer used to interconnect the various devices formed in an integrated circuit. Accordingly, a substrate is generally referred to as the material on which layers are formed and on which processes act. The second metal layer 110, the bulk conductor, will make up the main current carrying material of a subsequently formed interconnection. The bulk conductor is preferably aluminum doped with a small amount (0.5%) of copper formed by sputtering, but may also may be other low resistance material such as, but not limited to copper, silver, and tungsten, and mixtures thereof. The bulk conductor is formed thick enough to provide a suitable low resistance interconnect for the fabricated circuit. First metal layer 104 serves as a barrier layer and is formed over dielectric layer 102 prior to bulk conductor deposition in order to help prevent diffusion of the bulk conductor into the substrate and to provide adhesion to the substrate. The third metal layer 112 serves as a capping layer that is blanket deposited with well known techniques over bulk conductor. Besides TiN, the first and third metal layers can comprise, for example, TiW Ti, and W.

FIGS. 2A through 2C illustrate another application of the inventive method. As depicted in FIG. 2A, there is a semiconductor device substrate 200 having a dielectric layer 202 deposited thereon. Metal line 250 which comprises a first metal layer 204, second metal layer 210, and third metal layer 212 is formed on the dielectric layer. The dielectric and three metal layers may have the same compositions and thicknesses as those depicted in FIG. 1A. FIG. 2B shows the semiconductor device following (i) deposition of dielectric layer 240 over the semiconductor substrate, (ii) planarization, (iii) coating the device with photoresist 214 and formation of a mask pattern wherein the metal line is exposed, and (iv) etching via contact hole 230.

In etching processes used for forming the via contact hole, the polymer layer 270 on the sidewall of the photoresist layer and on the sidewall of the via contact hole is formed by the reaction of the photoresist layer, dielectric layer, and metal layers. FIG. 2C depicts the semiconductor device after removal of the sidewall polymer with the inventive process wherein the metal line is not etched.

Resist and sidewall polymer can be effectively removed with the inventive process which employs a mixture of $CF_4$ and $H_2O$ as the etch gas while achieving unexpectedly high selectivity with respect to the underlying metal materials. With the inventive process, it is expected that the selectivity, that is, the ratio of sidewall polymer etch rate to metal etch rate is at least about 5 to 1 and preferably up to about 50 to 1 or higher with respect to metal comprising, for example, Al, Cu, TiN, TiW, Ti, and W mixtures thereof. To achieve the highest selectivity with respect to underlying metal material preferably the ratio of $H_2O$ to $CF_4$ flow rates into the reactive chamber be at least about 2.5 to 1 and preferably up to about 5 to 1, or higher. With the inventive process, It is expected that the sidewall polymer etch rate can reach 5,000 Å/min. and preferably up to about 10,000 or Å/min. or higher.

To demonstrate the high selectivity of the $CF_4$ and $H_2O$ plasma, semiconductor wafers having the structure shown in FIG. 1B, were fabricated. The bulk conductor metal was AlCu and the barrier and capping layers were TiN. The wafers were first subject to metal etching and thereafter subject to resist and sidewall polymer stripping. The metal etcher was a LAM 9600 Transformer Coupled Plasma (TCP)™ reactor and the stripper was a LAM 9600 Decoupled Source Quartz-enclosed) DSQ™ reactor both of which were commercially available from Lam Research Corporation, Fremont, Calif. The DSQ unit is a module that is incorporated to the metal etcher so that wafers that have been metal etched in the TCP main chamber are transferred to the DSQ chamber for resist and sidewall polymer stripping.

Table 1 sets forth the process parameters employed in the metal etcher. The semiconductor wafer having the structure shown in FIG. 1A was held in place with a mechanical clamp that was subjected to helium cooling. The temperature of the clamp was maintained at different temperatures as shown. The power (watts) of the top and bottom electrodes both operating at 13.56 MHz also varied during the process. Finally, the flow rates of the process gases also changed to coincide with the different stages of the plasma etching process as different materials in the wafer are being etched. At the completion of the metal etching process, the semiconductor device had a plurality of line structures as depicted in FIG. 1B. The device was then subjected to resist and sidewall polymer stripping in the DSQ unit under the process parameters set forth in Table 2. The DSQ unit included a paddle which held the wafer during ashing. Processing occurred when the paddle was in the "up" position. The electrode also operated at 13.56 MHz.

TABLE 1

| Parameters | Steps | | | | | | | | |
|---|---|---|---|---|---|---|---|---|---|
| | 1 | 2 | 3 | 4 | 5 | 6 | 7 | 8 | 9 |
| Press. mT | 90 | 10 | 10 | 10 | 10 | 10 | 10 | 10 | 90 |
| RF Top W | 0 | 0 | 600 | 0 | 450 | 350 | 0 | 600 | 0 |
| RF Bot W | 0 | 0 | 75 | 0 | 150 | 150 | 0 | 25 | 0 |
| $Cl_2$ sccm | 0 | 0 | 0 | 50 | 50 | 50 | 0 | 0 | 0 |
| $BCl_3$ sccm | 40 | 40 | 40 | 15 | 15 | 15 | 60 | 60 | 0 |
| $SF_6$ sccm | 40 | 40 | 40 | 0 | 0 | 0 | 45 | 45 | 0 |
| $N_2$ sccm | 10 | 10 | 10 | 0 | 0 | 0 | 12 | 12 | 0 |
| $CHF_3$ sccm | 0 | 0 | 0 | 7 | 7 | 3 | 0 | 0 | 0 |
| He Clamp T | 0 | 3 | 3 | 8 | 8 | 8 | 3 | 3 | 0 |
| Time sec | 10 | 15 | 25 | 20 | 100 | 70 | 20 | 85 | 10 |

TABLE 2

| Parameters | Steps | | | | |
|---|---|---|---|---|---|
| | 1 | 2 | 3 | 5 | 6 |
| Paddle position | DN | UP | UP | DN | DN (Down) |
| Press. mT | 1200 | 1200 | 1200 | 0 | 0 |
| RF W | 0 | 0 | 1000 | 0 | 0 |
| $CF_4$ sccm | 0 | 80 | 80 | 0 | 0 |
| $H_2O$ sccm | 500 | 200 | 200 | 0 | 0 |
| Time sec | 5 | 15 | 90 | 3 | 0 |

FIG. 3 is a representative graph of etch rate vs. $H_2O$ flow rate which demonstrates the effect of adding $H_2O$ to etch gas comprising $CF_4$ to the selectivity of the stripping process. Curve A designates the resist/polymer etch rate and curve B designates TiN etch rate. As is apparent, selectivity (resist rate/TiN rate) increases steadily and reaches a maximum when the $H_2O$ flowrate is about 200 sccm. FIG. 4 is a graph of etch rate vs. the $H_2O$ to $CF_4$ ratio which shows that maximum selectivity is reached when this ratio is about 2.5. Increasing this ratio (relative to $CF_4$) does not appear to effect the selectivity significantly. It is understood that while an etchant gas mixture $CF_4$ and $H_2O$ is expected to demonstrate high selectivity in dry plasma etching in general, depending on various parameters, including, for instance, the plasma etchant device employed, flow rates of the gases, and material of the underlying metal(s), the maximum selectivity may be achieved at a different $H_2O$ to $CF_4$ ratio. In one embodiment, the etchant gas mixture consists essentially of $CF_4$ and $H_2O$.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A method of removing polymer from a semiconductor wafer which includes a multilayer metal structure on the wafer that comprises a first metal layer, a second metal layer, and optionally, a third metal layer that is a barrier layer which presents diffusion of second metal into the wafer, said method comprising the steps of:
   (a) positioning said wafer into a chamber wherein the wafer includes polymer that is adjacent to the multilayer metal structure;
   (b) introducing etchant gases comprising $CF_4$ and $H_2O$ into the chamber;
   (c) applying energy to the etchant gases to generate a plasma; and
   (d) etching the polymer, wherein the ratio of the etch rate for polymer to the etch rate for the multilayer metal structure is at least 5 to 1.

2. The method of claim 1 wherein the ratio of the $H_2O$ flow rate to the $CF_4$ flow rate into the chamber is at least about 2.5 to 1.

3. The method of claim 1 wherein the polymer is etched at a rate of at least about 5000 Å per minute.

4. The method of claim 1 wherein the first metal layer and third metal layer each comprises material that is selected from the group consisting of Ti, W, TiN, and TiW, and the second metal layer comprises material that is selected from the group consisting of aluminum and AlCu.

5. The method of claim 1 wherein the first metal layer and third metal layer each comprises TiN.

6. A method of removing post etch polymer residue from a semiconductor device containing a metal layer that is formed of material that is selected from the group consisting of Ti, W, TiN, and TiW and wherein the metal layer is adjacent to the polymer residue, said method comprising the steps of:
   (a) positioning said semiconductor device into a chamber;
   (b) introducing etchant gases consisting essentially of $CF_4$ and $H_2O$ into the chamber;
   (c) applying energy to the etchant gases; and
   (d) etching the polymer residue wherein the ratio of the etch rate for residue polymer to the etch rate for the metal layer is at least 5 to 1.

7. The method of claim 6 wherein the ratio of the $H_2O$ flow rate to the fluorine-containing compound flow rate into the chamber is at least about 2.5 to 1.

8. The method of claim 6 wherein the ratio of the etch rate for residue polymer to the etch rate for metal layer is at least 5 to 1.

9. The method of claim 6 wherein the residue polymer is etched at a rate of at least about 5000 Å per minute.

10. A method of forming a via contact hole in a semiconductor device that comprises the steps of:
    (a) forming a metal structure on a wafer wherein the metal structure comprises a first metal layer and a second metal layer that is underneath the first metal layer;
    (b) forming a dielectric layer on said first metal layer;
    (c) forming a photoresist pattern after a photoresist layer is coated on said dielectric layer;
    (d) forming a via contact hole by an etching process employing said photoresist pattern as a mask; and
    (e) removing a layer of polymer on said via contact hole and at least a part of said photoresist layer by a process comprising the steps of:
       (i) positioning said semiconductor device comprising said via contact hole into a chamber;
       (ii) introducing etchant gases comprising $CF_4$ and $H_2O$ into the chamber;
       (iii) applying energy to the etchant gases generate a plasma; and
       (iv) etching the polymer wherein the ratio of the etch rate for polymer to the etch rate for the capping metal is at least 5 to 1.

11. The method of claim 10 wherein the ratio of the etch rate for sidewall polymer to the etch rate for metal is at least 5 to 1.

12. The method of claim 10 wherein the polymer is etched at a rate of at least about 5000 Å per minute.

13. The method of claim 10 wherein the first metal is material that is selected from the group consisting of TiN, TiW, Ti and W.

14. The method of claim 10 wherein the first metal layer is TiN.

15. The method of claim 10 wherein the second conductor metal layer is selected from aluminum and AlCu.

16. The method of claim 1 wherein the etchant gases consist essentially of $CF_4$ and $H_2O$.

17. The method of claim 5 wherein the ratio of the $H_2O$ flow rate to the $CF_4$ flow rate into the chamber is at least about 2.5 to 1.

18. The method of claim 5 wherein the ratio of the etch rate for polymer to the etch rate for the capping metal layer is at least 50 to 1 and the ratio of the etch rate for polymer to the etch rate for barrier metal layer is at least 50 to 1.

19. The method of claim 5 wherein the etchant gases consist essentially of $CF_4$ and $H_2O$.

20. The method of claim 6 wherein the ratio of the etch rate for residue polymer to the etch rate for metal layer is at least 50 to 1.

21. The method of claim 10 wherein the etchant gases consist essentially of $CF_4$ and $H_2O$.

22. The method of claim 21 wherein the ratio of the $H_2O$ flow rate to the $CF_4$ flow rate into the chamber is at least about 2.5 to 1.

23. The method of claim 10 wherein the ratio of the etch rate for polymer to the etch rate for first metal layer is at least 5 to 1.

24. The method of claim 10 wherein the ratio of the etch rate for polymer to the etch rate for the first metal layer is at least 50 to 1.

* * * * *